(12) United States Patent
Fasthuber et al.

(10) Patent No.: US 9,000,348 B2
(45) Date of Patent: Apr. 7, 2015

(54) METHOD AND APPARATUS FOR CARRYING OUT A SWITCHING PROCESS USING AN OPERATING ELEMENT INCLUDING AT LEAST ONE LIGHT-EMITTING DIODE AS A DISPLAY AND A DEVICE FOR MEASURING THE VOLTAGE OF SAME

(75) Inventors: Christian Fasthuber, Wels (AT); Florian Schuster, Traun (AT); Gerald Ortner, Linz/Donau (AT); Michael Sandberger, Linz (AT)

(73) Assignee: Fronius International GmbH, Pettenbach (AT)

( * ) Notice: Subject to any disclaimer, the term of this patent is extended or adjusted under 35 U.S.C. 154(b) by 328 days.

(21) Appl. No.: 13/697,849

(22) PCT Filed: May 26, 2011

(86) PCT No.: PCT/AT2011/000241
§ 371 (c)(1),
(2), (4) Date: Nov. 14, 2012

(87) PCT Pub. No.: WO2011/150437
PCT Pub. Date: Dec. 8, 2011

(65) Prior Publication Data
US 2013/0062507 A1    Mar. 14, 2013

(30) Foreign Application Priority Data

May 31, 2010    (AT) .................................. A 880/2010

(51) Int. Cl.
*H01J 40/14*    (2006.01)
*H03K 17/96*    (2006.01)
(52) U.S. Cl.
CPC .................................. *H03K 17/9631* (2013.01)

(58) Field of Classification Search
CPC ......... G01J 1/4204; G01J 1/44; G01J 1/1626; G01J 1/4228
USPC ...... 250/214 R, 214 AL, 214 LS, 214.1, 221, 250/214 SW; 327/514, 515, 345; 363/49; 200/61.02
See application file for complete search history.

(56) References Cited

U.S. PATENT DOCUMENTS

| 8,129,671 B2 * | 3/2012 | Shimizu et al. ........... 250/214 A |
| 2003/0020004 A1 | 1/2003 | Reime |
| 2004/0217267 A1 | 11/2004 | Reime |

FOREIGN PATENT DOCUMENTS

| AU | 9 064 662 | 2/1993 |
| DE | 41 14 763 | 11/1992 |
| DE | 10 2007 025243 | 1/2009 |
| EP | 0 298 329 | 1/1989 |
| EP | 0 809 371 | 11/1997 |

OTHER PUBLICATIONS

English translation of the International Preliminary Report on Patentability in PCT/AT2011/000241, Dec. 6, 2012.
(Continued)

*Primary Examiner* — Que T Le
(74) *Attorney, Agent, or Firm* — Collard & Roe, P.C.

(57) ABSTRACT

The invention relates to a method and an apparatus for performing a switching operation with the aid of a operation element (13). In order to avoid mechanical components, at least one light-emitting diode (14) is used as the operating element (13), and the voltage (U) on the at least one light-emitting diode (14) is measured in the switched-off state, and the switching operation is performed when the measured voltage (15) falls below a pregiven lower threshold (18) over a pregiven time period (19).

15 Claims, 4 Drawing Sheets

(56) References Cited

OTHER PUBLICATIONS

Austrian Office Action dated May 31, 2010 in Austrian Patent Application No. A 880/2010 along with an English translation of same.

International Search Report of PCT/AT2011/000241, date of mailing Sep. 21, 2011.

* cited by examiner

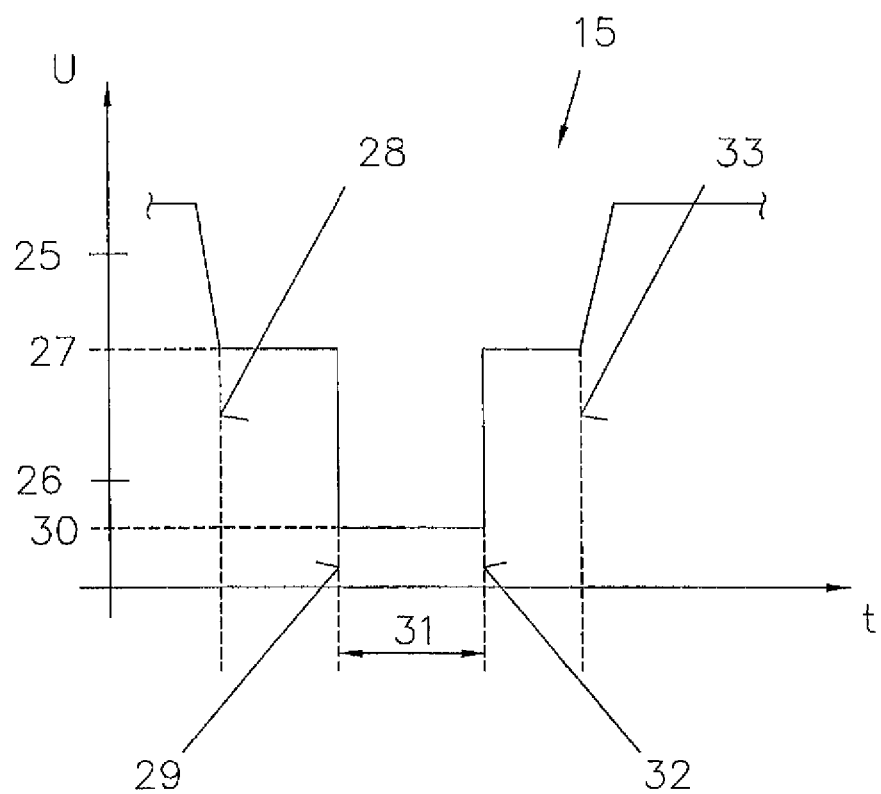

METHOD AND APPARATUS FOR CARRYING OUT A SWITCHING PROCESS USING AN OPERATING ELEMENT INCLUDING AT LEAST ONE LIGHT-EMITTING DIODE AS A DISPLAY AND A DEVICE FOR MEASURING THE VOLTAGE OF SAME

CROSS REFERENCE TO RELATED APPLICATIONS

This application is the National Stage of PCT/AT2011/000241 filed on May 26, 2011, which claims priority under 35 U.S.C. §119 of Austrian Application No. A 880/2010 filed on May 31, 2010, the disclosure of which is incorporated by reference. The international application under PCT article 21(2) was not published in English.

BACKGROUND OF THE INVENTION

1. Field of the Invention

The invention relates to a method and a device for performing a switching operation by the aid of an operating element.

2. Description of the Related Art

Switching operations are usually performed using mechanical operating elements such as push-buttons or switches. Such mechanical components are subject to a certain wear and, moreover, require some space on the respective device, which is not always available.

SUMMARY OF THE INVENTION

The object of the present invention, therefore, is to provide an above-identified method, and an above-identified device, for performing a switching operation by the aid of an operating element, by which said drawbacks will be avoided.

In method terms, this object is achieved in that at least one light-emitting diode is used as said operating element, the voltage on the at least one light-emitting diode is measured in the switched-off state, and the switching operation is performed if and when the measured voltage falls below a pregiven lower threshold for a pregiven time period. According to this method, a light-emitting diode provided, for instance, to display an operating state of an appliance is, therefore, used as operating element. Consequently, no separate operating element is required to perform the switching operation, thus saving both space and costs. Besides, light-emitting diodes as opposed to mechanical operating elements are not subject to wear, thus eliminating malfunctions. Light-emitting diodes also provide a galvanic separation, thus reducing the probability of the occurrence of connections to live parts. Moreover, switching operations will hardly be affected by environmental influences such as contamination, moisture, splash water etc. Devices such as, e.g., inverters, welding apparatus, cutters, battery chargers, fuel cells or the like can thus be operated, or at least specific switching operations on these devices can thus be performed, via potentially already existing light-emitting diodes without needing mechanical operating elements. It goes without saying that even several switching operations can be consecutively performed so as to trigger specific operations or carry out settings on the respective device. Voltage measurements are taken continuously or at periodic intervals with an appropriately selected sampling frequency.

In order to avoid faulty switching due to changing ambient light conditions, it is provided that the switching operation is performed if and when the measured voltage on the at least one light-emitting diode, after having fallen below the pregiven lower threshold, additionally rises above a pregiven upper threshold. In order to trigger a switching operation, it is thus absolutely necessary for the user to again remove his/her finger actively from the at least one light-emitting diode such that a new voltage rise can again be measured after the voltage drop.

In addition, the condition can be further attached to a pregiven time period during which the measured voltage has to exceed the pregiven upper threshold in order to perform a switching operation.

If and when the upper threshold of the measured voltage on the at least one light-emitting diode is changed as a function of the intensity of the ambient light, a sensitivity adjustment can be established.

The at least one light-emitting diode can be periodically switched off, and upon switching-off the measurement of the voltage on the at least one light-emitting diode can each be started in the switched-off state. It has thus become possible to perform switching operations at the periodically recurring, short intervals also with a light-emitting diode used for specific signaling. These time intervals can be selected to be so short as to be invisible to the eye.

The object of the invention in method terms is also achieved in that at least one light-emitting diode is used as said operating element, the voltage on the at least one light-emitting diode is measured in the switched-off state, the at least one light-emitting diode is irradiated by at least one reference light-emitting diode during the switched-off state, the voltage on the at least one light-emitting diode is measured in the switched-off state irradiated by the at least one reference light-emitting diode and the reference light-emitting diode is subsequently switched off, the voltage on the at least one light-emitting diode is measured in the switched-off state, and the switching operation is performed if and when the measured voltage falls below a pregiven lower threshold for a pregiven time period. In the second embodiment of the invention, a defined background illumination is provided by the at last one reference light-emitting diode, thus achieving a safe switching operation, in particular with little ambient light, or an independence from ambient light.

The at least one reference light-emitting diode can be switched on after a defined time period.

The switching-off of the at least one reference light-emitting diode can be effected as a function of the measured voltage.

In the second embodiment, the additional condition that the measured voltage lies within a pregiven evaluation range can be introduced for performing a switching operation. This will allow for the achievement of an elevated safety during switching.

In an advantageous manner, the execution of the switching operation is signaled. This feedback for the user can be provided optically, for instance by activating a light-emitting diode or another light element, acoustically or mechanically, for instance by means of a vibrating element.

The object according to the invention is also achieved by an above-identified device, wherein the operating element is formed by at least one light-emitting diode, a device for measuring the voltage on the at least one light-emitting diode in the switched-off state is provided to enable the switching operation if and when the measured voltage falls below a pregiven lower threshold for a pregiven time period. Such a device can be produced in a relatively simple, space-saving and cost-effective manner. When using several light-emitting diodes connected in series as said operating element, the amplitude of the voltage caused by the photoelectric effect, or the voltage rise, can be increased, and the resolution of the measurement can thus be improved.

The measuring device is advantageously formed by an accordingly sensitive measuring amplifier.

Advantages will further result, if a resistor is connected in parallel with the at least one light-emitting diode, and the connections of the at least one light-emitting diode, which are connected to the measuring device, are each connected to ground via a capacitor.

In order to create a defined background illumination, at least one reference light-emitting diode can be provided to suitably illuminate the at least one light-emitting diode during the measuring procedure in order to perform the switching operation.

In order to avoid an undesired extraneous light irradiation, a partially opaque cover is arranged around the at least one light-emitting diode and optionally the at least one reference light-emitting diode.

BRIEF DESCRIPTION OF THE DRAWINGS

The present invention will now be explained in more detail by way of the attached, schematic drawings.
Therein:
FIG. 7 illustrates the voltage curve on the light-emitting diode of the second variant during a switching operation.

DETAILED DESCRIPTION OF THE PREFERRED EMBODIMENTS

Figure 1:
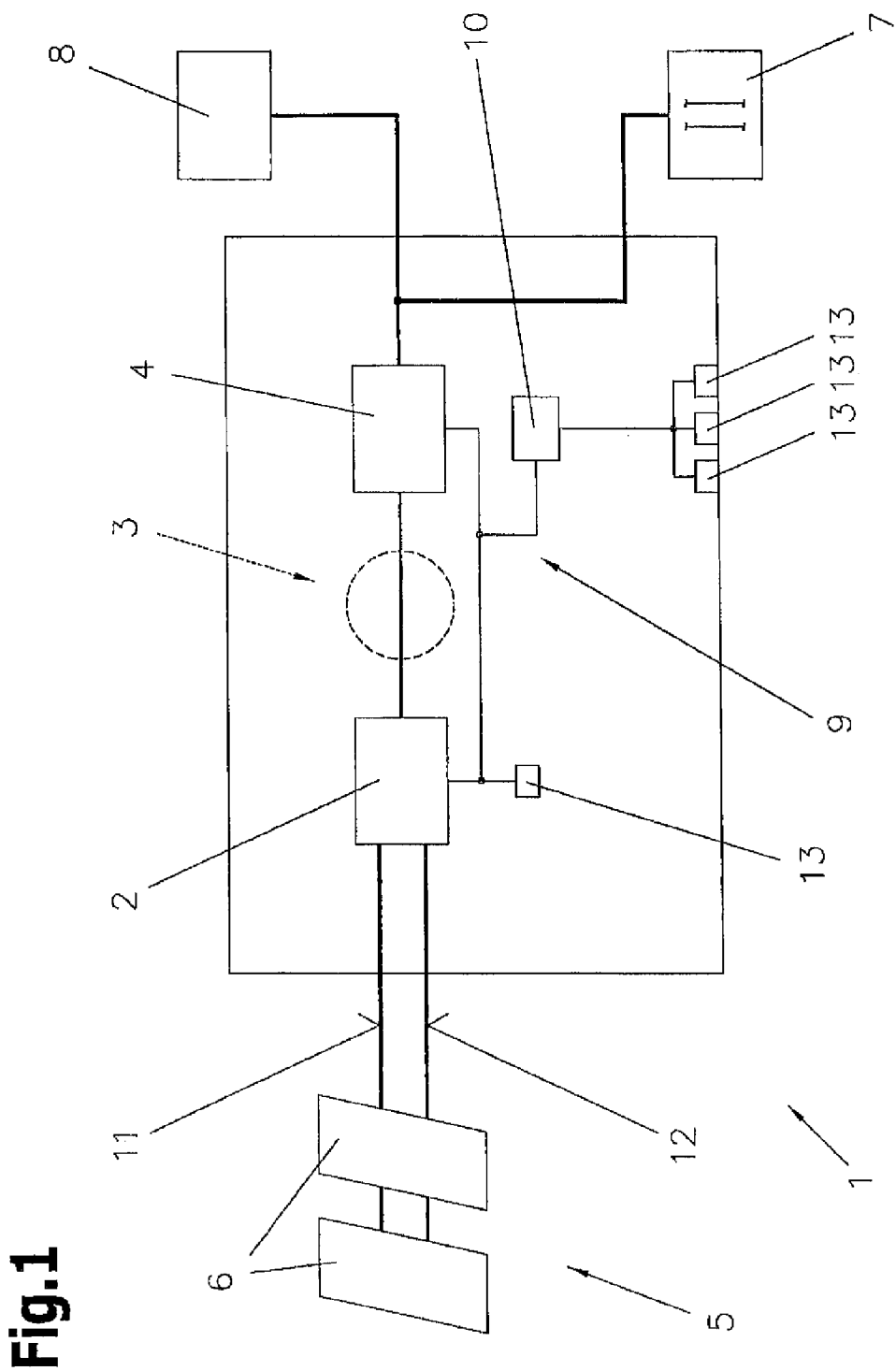
FIG. 1 gives a schematic overview of an inverter of a photovoltaic system.

To begin with, it should be noted that identical parts of the exemplary embodiments bear the same reference numerals.

FIG. 1 illustrates the structure of a known inverter 1, in detail a HF inverter, of a photovoltaic system (PV system). Since the individual components or assemblies and functions of inverters 1 are already known from the prior art, these will not be discussed in detail below.

The inverter 1 comprises at least one input DC/DC converter 2, an intermediate circuit 3, and an output DC/AC converter 4. To the input DC/DC converter 2 is connected an energy source 5, which is preferably formed by one or several solar modules 6 that are connected in parallel and/or in series. The output of the inverter 1, and the output DC/AC converter 4, respectively, can be connected to a power supply system 7 such as a public or private AC voltage network or a polyphase power grid, and/or to at least one electrical consumer 8, which constitutes a load. The consumer 8 is, for instance, comprised of a motor, a refrigerator, a radio equipment etc. The consumer 8 may also be a domestic power supply unit. The individual components of the inverter 1 can be connected to a control device 10 via a data bus 9.

In a preferred manner, such an inverter 1 serves as a so-called grid-connected inverter 1, whose energy management is optimized with a view to feeding as much energy into the power supply system 7 as possible. As is known from the prior art, the consumers 8 are supplied via the power supply system 7. It goes without saying that several inverters 1 connected in parallel may also be used, thus making even more energy available to operate the consumers 8. The energy is supplied from the energy source 5 in the form of DC voltage and fed to the inverter 1 via two connection lines 11, 12.

The control device 10 of the inverter 1 is, for instance, formed by a microprocessor, microcontroller or computer. The appropriate control or regulation of the individual components of the inverter 1, such as the input DC/DC converter 2 or the output DC/AC converter 4, and, in particular, the switching elements disposed therein can be effected via the control device 10. To this end, the individual control sequences are stored in the control device 10 by suitable software programs and/or data or characteristic curves.

Operating elements 13 are, furthermore, connected to the control device 10 to enable the user to, for instance, configure the inverter 1 and/or to display, e.g. by means of light-emitting diodes, and set operating states or parameters. The operating elements 13 are connected to the control device 10, for instance via the data bus 9 or directly. Such operating elements 13 are, for instance, disposed on a front of the inverter 1 so as to enable external operation. The operating elements 13 can be directly disposed on assemblies and/or modules within the inverter 1.

In accordance with the invention, it is now provided that the operating elements 13 are each formed by at least one light-emitting diode 14. To actuate the operating elements 13, the voltage U on the switched-off light-emitting diode 14 is measured. Said voltage U depends on the ambient brightness such that a voltage on the light-emitting diode 14, which is induced by the photoelectric effect, is measured. Accordingly, also the voltage U will change at a change of the ambient brightness. A switching operation will be triggered at a defined curve of the voltage U.

The ambient brightness is preferably altered by an operator shading the light-emitting diode 14 by a finger, e.g. by covering the former. In principle, this corresponds to the actuation of a switching element and/or the push of a button, wherein the switching operation is triggered by a change in the voltage U on the at least one light-emitting diode 14 due to a change in the incident ambient brightness. To this end, the voltage change is compared to a pregiven time curve such that only deliberately induced switching operations will be triggered.

By way of example, this principle will be described in detail below on the basis of two different variants.

Figure 2:
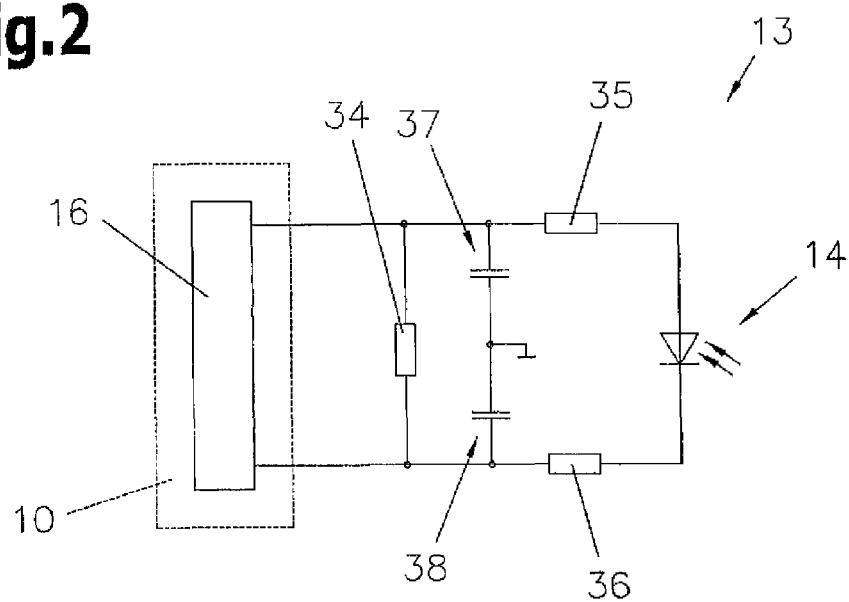
FIG. 2 illustrates the structure of a first variant of a device for performing a switching operation.
Figure 3:
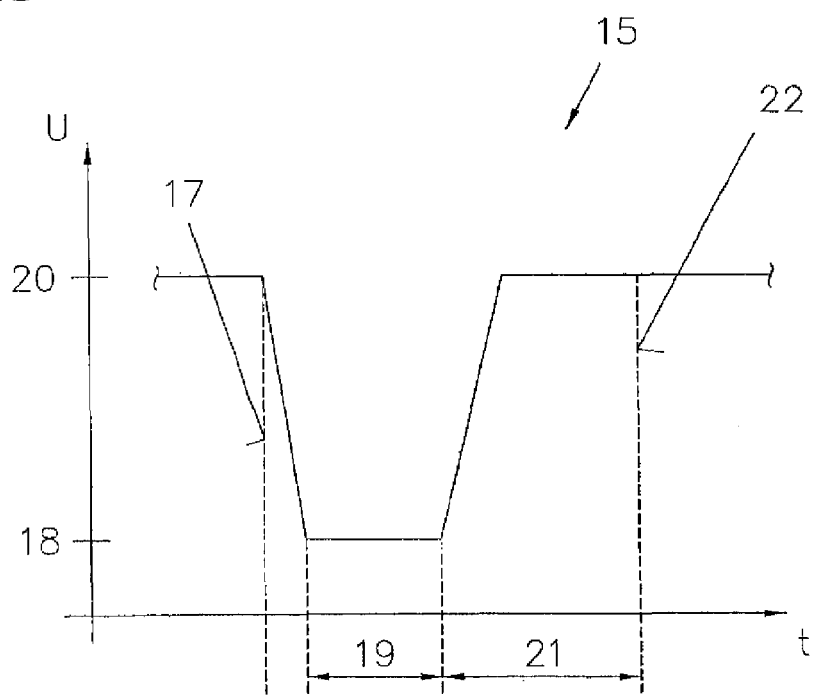
FIG. 3 depicts the voltage curve on the light-emitting diode of the first variant during a switching operation.

In the first variant according to FIGS. 2 and 3, a light-emitting diode 14 of a data communication module of an inverter 1 of a photovoltaic system serves to display the operating state. The light-emitting diode 14 can be arranged on a front side of the casing of the inverter 1 or in a part of an operating front of the inverter 1. The light-emitting diode 14 lights up during normal operation and is off in the case of a failure. The data communication module is, for instance, switched off by an integrated overcurrent limiter. Thus, at least the control device 10 of the inverter 1 will know the state of the light-emitting diode 14. After the failure has been checked and/or cleared by an operator, the latter has to reactivate the data communication module. This is effected based on the principle according to the invention with the light-emitting diode 14 serving as operating element 13. To this end, a certain ambient brightness provided, for instance, by daylight or by suitable lighting is presupposed, which will automatically happen by the user being present in the case of a failure.

Moreover, the voltage 15 on the switched-off light-emitting diode 14 is measured either continuously or at periodic time intervals, for instance in the millisecond range. This is preferably done via a measuring amplifier 16 such as a differential input of a microcontroller, whereby the voltage U is accordingly amplified. The measuring amplifier 16 is preferably integrated in the control device 10. If the data communication module is to be switched on again, the operator will shade the light-emitting diode 14 by placing his finger over the light-emitting diode 14, thus covering the light-emitting diode 14. The measured voltage 15 will accordingly drop, since the ambient brightness is decreasing, or the light-emitting diode 14 is no longer illuminated by any ambient brightness. According to FIG. 3, dimming takes place at time 17. However, no switching operation is yet triggered, since at first the further behavior of the changes in the voltage 15 is evaluated. In order to trigger a switching operation, the voltage 15 must drop to a predefined lower threshold 18. Said threshold 18 has to be undershot at least over a defined time period 19 and/or within a defined time window 19. The light-emitting diode 14 thus has to be shaded for at least said defined period 19. As soon as the defined period 19, e.g. 400 ms, has been exceeded and the finger has been removed from the light-emitting diode 14, the voltage 15 will again rise to the value before dimming. This value is referred to as the upper threshold 20. If and when this upper threshold 20 is likewise exceeded for a defined period 21, e.g. also 400 ms, a switching operation is performed at time 22. The thresholds 18 and 20 and the durations of the time periods 19 and 21 can be stored in a memory of the inverter 1, and the measured values can be compared with the stored values. The curve of the measured voltage 15 thus has to comprise a drop and a rise in order for a switching operation to be performed. It is thus ensured that a switching procedure will only be performed after having deliberately shaded the light-emitting diode 14—e.g. by covering with the finger. The successfully performed switching operation is, for instance, signaled to the user by switching on again the light-emitting diode 14—which was used for measuring. In addition to such visible signaling, acoustic signaling, mechanical signaling by vibration and/or the like may be performed.

The periodical switching on and off of the light-emitting diode 14 also enables the consecutive performance of several switching operations—for instance for specific settings. The periods in this case are selected such that the light-emitting diode 14 will appear to be constantly on to the user. Thus, short-term dark phases, in which the method according to the invention can be carried out, are thus generated.

The voltage change between the thresholds 18 and 20 depends on the ambient brightness. Consequently, the evaluation is more sensitive at a low ambient brightness, since the difference between the thresholds 18 and 20 is reduced. The voltage 15 supplied with the light-emitting diode 14 switched off therefore depends on the ambient brightness. The upper threshold 20 thus changes continuously with the prevailing ambient brightness such that the upper threshold 20 should be periodically re-stored.

In order to achieve an independence of the upper threshold 20 from the ambient brightness, the light-emitting diode 14 can be illuminated by a reference light-emitting diode 23. This will be described below on the basis of two variants of the invention by way of FIGS. 4 to 7. In this respect, it should be noted that only the differences relative to the first variant will be described such that parts from the description of the first variant can also be transferred to the second variant.

In this variant, the light rays of the reference light-emitting diode 23 are reflected and/or deflected towards the light-emitting diode 14 to detect a switching operation. To this end, both the light-emitting diode 14 and the reference light-emitting diode 23 are, for instance, positioned substantially one beside the other at a defined distance below a transparent cover 24, as is apparent from FIG. 5. The cover 24 may be comprised of an operating front of the inverter 1. In a further embodiment (not illustrated), the reference light-emitting diode 23, for instance, illuminates a substrate with integrated reflective layers so as to enable a very flat switching element configuration. It will consequently not be necessary to arrange the light-emitting diode 14 and the reflection light-emitting diode 23 one beside the other.

Figure 6:
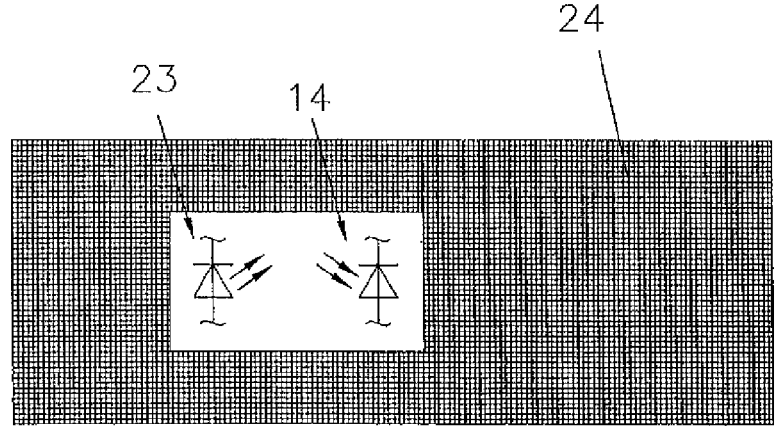
FIG. 6 is a schematic top view of the arrangement according to FIG. 5.

The region of the cover 24 around the light-emitting diode 24 and the reference light-emitting diode 23 is light-protected, thus preventing ambient light from intruding laterally, as is apparent from FIG. 6. It will thus be ensured that, during shading by the finger, no ambient light will reach the light-emitting diode 14 while a switching element and/or operating element 13 will be recognizable to the user. The operating element 13 thus is the result of the region that is configured to be translucent.

As in the first variant embodiment, the voltage 15 of the light-emitting diode 14 is measured in the dimmed state also in the second embodiment. As opposed to the first variant, a constant brightness is, however, generated in this case by the reference light-emitting diode 23, and the respective voltage 15 is measured as soon as the light rays of the reference light-emitting diode 23 are reflected and/or deflected towards the light-emitting diode 14. The deflection is caused by the user's finger on the cover 24. The brightness of the reference light-emitting diode 23 will thus be measured during shading. If no shading occurs, the ambient brightness will be measured.

However, in order to prevent a switching operation from being performed at an ambient brightness—which corresponds to the brightness according to the reference light-emitting diode 23—, an upper threshold 25 and a lower threshold 26 of the measured voltage 15, and a appropriate evaluation range between said threshold values 25 and 26, are defined. The evaluation range will, of course, dynamically adapt to the external environmental conditions such that the sensitiveness for the execution of a switching operation will be optimally tuned to the respective application.

The thresholds 25 and 26, respectively, lie above and below the brightness level defined by the reference light-emitting diode 23. With a measured brightness lying within the evaluation range, an evaluation of the voltage takes place before a switching operation will be performed. If a brightness beyond the evaluation range is measured, no further steps will be taken. A switching operation will thus be exclusively performed with measured voltages U lying within the evaluation range. Said evaluation will be described in detail below.

Basically, the reference light-emitting diode 23 constantly lights up such that a switching operation is feasible at any time. To trigger a switching operation, the light-emitting diode 14 and the reference light-emitting diode 23 are suitably shaded by the finger such that the light rays of the reference light-emitting diode 23 are reflected to the light-emitting diode 14 and no ambient brightness will reach the light-emitting diode 14. A voltage value 27 of the light-emitting diode 14 lying within the evaluation range will thus be measured for the brightness in a first step from time 28 according to FIG. 7. As illustrated, the voltage drops, for instance, after shading, and the constant voltage value 27 will be measured according to the brightness of the reference light-emitting diode 23. Thus a basic prerequisite for the intention to perform a switching operation is fulfilled. Under this basic prerequisite, the reference light-emitting diode 23 is switched off at time 29, and the voltage on the light-emitting diode 14 is measured anew in a second step. Shading by the finger will, therefore, substantially prevent light from reaching the light-emitting diode 14 such that a voltage value 30 below the lower threshold 26 will be measured. If and when said voltage value 30 is measured over a defined time period 31, and/or said value lies within a defined time window 31, the switching operation will be performed at time 32.

The switching operation will consequently also be performed, if and when the light-emitting diode 14 is still shaded by the finger. In this respect, it is essential that by the measurement in the second step a lower value is measured for the voltage than by the measurement in the first step. The switching operation causes the reference light-emitting diode 23 to be switched on again, thus enabling a further switching operation to be carried out subsequently. At time 33, the finger is again removed such that the ambient brightness is again measured. In this case, the ambient brightness is higher than the brightness of the reference light-emitting diode 23.

The measurement according to the second step will exclude that a switching operation is performed without shading by the finger. This is because, even though in the first step a value within the evaluation window is measured for the voltage due to the ambient brightness, said value does not change during the measurement in the second step. Thus, no switching operation is performed either.

The controllable switching of the reference light-emitting diode 23 allows for the adjustment of the time intervals at which a switching operation can be performed. Consequently, the switching operations can be performed very quickly one after the other so as to enable rapid operation even with several setting options.

In the two variant embodiments, the execution of a switching operation has each been described. It goes without saying that a further switching operation can be performed after having completed a switching operation.

Figure 4:
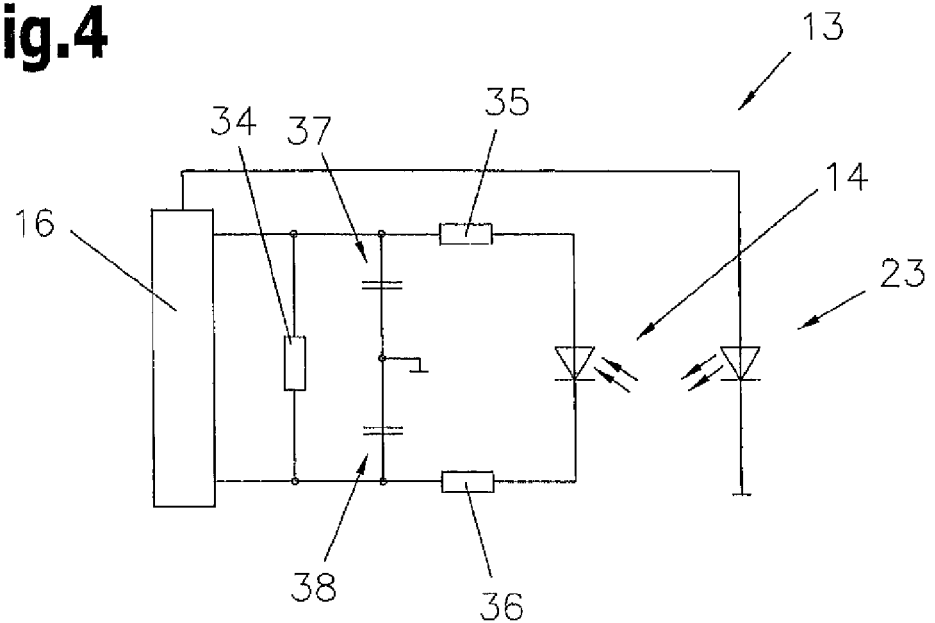
FIG. 4 illustrates the structure of a second variant of a device for performing a switching operation.
Figure 5:
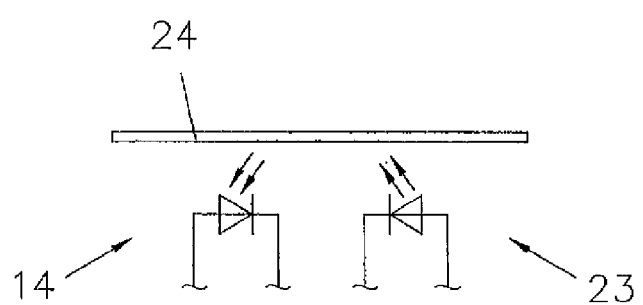
FIG. 5 depicts a schematic, sectional illustration of the arrangement of the light-emitting diode and a reference light-emitting diode behind a cover.

The wiring of the light-emitting diode 14, which is coupled to a microcontroller, for the principle according to the invention as depicted in FIGS. 2 and 4 is preferably realized using a parallel resistor 34, two series resistors 35, 36 and two capacitors 37, 38. The microcontroller preferably comprises an internal amplifier to amplify the measured voltage of the switched-off light-emitting diode 14 to the upper threshold 20. In order to prevent the measured voltage U from being affected by interferences, capacitors 37, 38, which are connected to ground, are respectively connected to two oppositely poled connections of the at least one light-emitting diode 14. The dimensions of the capacitors 37, 38 constitute a compromise between minimum interference effects and the evaluation speed. In order to achieve both, the resistor 34 is connected in parallel with the light-emitting diode 14.

The principle according to the invention, which has been described with reference to an inverter 2 can, of course, be transferred to other appliances. Thus, the operating element can, for instance, be used without mechanical switches in welding apparatus, battery chargers, fuel cells or the like.

The invention claimed is:

1. A method for performing a switching operation by the aid of an operating element, comprising the steps of:
providing an operating element with at least one light-emitting diode provided as a display,
in the switched-off state, measuring the voltage on the at least one light-emitting diode, wherein the voltage on the at least one light-emitting diode is induced by ambient light and measured in the switched-off state, and
performing a switching operation if and when the measured voltage falls below a pre-given lower threshold for a pre-given time period because of the shading of the at least one light-emitting diode due to a brightness reduction of the ambient light.

2. The method according to claim 1, wherein the switching operation is performed if and when the measured voltage, after having fallen below the pre-given lower threshold (18), additionally rises above a pre-given upper threshold (20).

3. The method according to claim 2, wherein the switching operation is performed if and when the measured voltage additionally rises above the pre-given upper threshold for a further pre-given time period.

4. The method according to claim 2, wherein the upper threshold is changed as a function of the intensity of the ambient light.

5. The method according to claim 1, wherein the at least one light-emitting diode is periodically switched off, and upon switching-off the measurement of the voltage on the at least one light-emitting diode is each started in the switched-off state.

6. A method for performing a switching operation by the aid of an operating element, comprising the steps of:
providing an operating element with at least one light-emitting diode as a display,
in the switched-off state, measuring the voltage on the at least one light-emitting diode, wherein the voltage on the at least one light-emitting diode is measured in the switched-off state,
irradiating the at least one light-emitting diode by at least one reference light-emitting diode during the switched-off state, wherein the voltage on the at least one light-emitting diode is induced by the light of the reference light-emitting diode and measured in the switched-off state irradiated by the at least one reference light-emitting diode,
subsequently switching off the at least one reference light-emitting diode,
measuring the voltage on the at least one light-emitting diode in the switched-off state, and
performing a switching operation if and when the measured voltage falls below a pre-given lower threshold for a pre-given time period because of the shading of the at least one light-emitting diode.

7. The method according to claim 6, wherein the at least one reference light-emitting diode is switched on after a defined time period.

8. The method according to claim 6, wherein the at least one reference light-emitting diode is switched off as a function of the measured voltage.

9. The method according to claim 6, wherein the switching operation is only performed, if and when the measured voltage lies within a pre-given evaluation range between an upper threshold and a lower threshold.

10. The method according to claim 1, wherein the execution of the switching operation is signaled optically, acoustically or mechanically.

11. A device for performing a switching operation by the aid of an operating element, comprising:
an operating element formed by at least one light-emitting diode as a display, and
a device for measuring the voltage induced by ambient light on the at least one light-emitting diode in a switched-off state, wherein the measured voltage is provided to enable the switching operation if and when the measured voltage falls below a pre-given lower threshold for a pre-given time period because of the shading of the at least one light-emitting diode due to a brightness reduction of the ambient light.

12. The device according to claim 11, wherein the device for measuring the voltage is formed by a measuring amplifier.

13. The device according to claim 11, wherein a resistor is connected in parallel with the at least one light-emitting diode, and wherein connections of the at least one light-emitting diode are connected to the device for measuring the voltage and are each connected to ground via a capacitor.

14. The device according to claim 11, wherein at least one reference light-emitting diode is provided to create a defined ambient light.

15. The device according to claim 11, wherein a partially opaque cover is arranged around the at least one light-emitting diode and optionally the at least one reference light-emitting diode.

\* \* \* \* \*